US009735989B1

(12) United States Patent
Xie et al.

(10) Patent No.: US 9,735,989 B1
(45) Date of Patent: Aug. 15, 2017

(54) CONTINUOUS TIME LINEAR EQUALIZER THAT USES CROSS-COUPLED CASCODES AND INDUCTIVE PEAKING

(71) Applicant: Oracle International Corporation, Redwood Shores, CA (US)

(72) Inventors: Jingqiong Xie, San Jose, CA (US); Ashok V. Krishnamoorthy, San Diego, CA (US); Xuezhe Zheng, San Diego, CA (US); Jeffrey W. Denq, Saratoga, CA (US); Kannan Raj, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/190,575

(22) Filed: Jun. 23, 2016

(51) Int. Cl.
| H04L 25/03 | (2006.01) |
| H04L 27/01 | (2006.01) |
| H04B 3/14 | (2006.01) |
| H03F 3/45 | (2006.01) |
| H04L 25/08 | (2006.01) |
| H04L 25/02 | (2006.01) |
| H04B 1/12 | (2006.01) |

(52) U.S. Cl.
CPC ... *H04L 25/03885* (2013.01); *H03F 3/45188* (2013.01); *H03F 3/45201* (2013.01); *H04B 3/14* (2013.01); *H04L 25/0272* (2013.01); *H04L 25/03878* (2013.01); *H04L 25/085* (2013.01); *H04L 27/01* (2013.01); *H03F 2203/45318* (2013.01); *H04B 1/123* (2013.01)

(58) Field of Classification Search
CPC ......... H04L 25/03878; H04L 25/03885; H04L 25/0272; H04L 25/085; H04L 27/01; H03F 2203/45318; H03F 3/45188; H03F 3/45201; H04B 3/14; H04B 1/123
See application file for complete search history.

(56) References Cited

U.S. PATENT DOCUMENTS 7,408,409 B2 *   8/2008   Kern .................... H03F 1/08
                                                 330/253
8,537,886 B1 *   9/2013   Su ..................... H04L 25/03038
                                                 375/233

(Continued)

OTHER PUBLICATIONS

Q. Pan, et al., "An 18-Gb/s Fully Integrated Optical Receiver With Adaptive Cascaded Equalizer," in IEEE Journal of Selected Topics in Quantum Electronics, vol. 22, No. 6, pp. 361-369, May 30, 2016.*

(Continued)

*Primary Examiner* — Michelle M Koeth
(74) *Attorney, Agent, or Firm* — Park, Vaughan, Fleming & Dowler LLP

(57) ABSTRACT

The disclosed embodiments relate to the design of an equalizer that uses both cross-coupled cascodes and inductive peaking to reduce distortion in a signal received from a communication channel by attenuating lower frequencies and amplifying higher frequencies. At lower frequencies, when the effects of inductive impedance within the equalizer are negligible, the equalizer essentially functions as a traditional cascode amplifier that presents high gain. At higher frequencies, the increases in inductive impedances within the equalizer act to boost a gain of the equalizer.

14 Claims, 3 Drawing Sheets

(56) References Cited

U.S. PATENT DOCUMENTS 8,816,745 B1* 8/2014 Raman ........... H03K 19/018507
327/306
9,288,085 B2* 3/2016 Bulzacchelli ..... H04L 25/03057

OTHER PUBLICATIONS

B. Razavi, "The StrongARM Latch [A Circuit for All Seasons]," in IEEE Solid-State Circuits Magazine, vol. 7, No. 2, pp. 12-17, Jun. 22, 2015.*

Chen et al.; "Electrical Backplane Equalization Using Programmable Analog Zeros and Folded Active Inductors", IEEE Trans. on Microwave Theory and Techniques, vol. 35. No. 7, Jul. 2007, pp. 1459-1466.

Mataya et all; IF Amplifier Using Cc Compensated Transistors, IEEE Journal of Solid-State Circuits, vol. sc-3, No. 4, Dec. 1968.

Maeng et al.; "0.18-um CMOS Equalization Techniques for 10-Gb/s Fiber Optical Communication Links", Manuscript received Apr. 4, 2005, revised Jun. 14, 2005, Digital Object Identifier 10.1109/TMTT.2005.857108, 0018-9480//$20.00 (c) 2005 IEEE.

Dhanasekaran et al; "A 1.1 GHz Fifth Order Active-LC Butterworth Type Equalizing Filter", Manuscript received Oct. 3, 2005, revised Jun. 11, 2007, Digital Object Identifier 101109/JSSC.2007.0907170. IEEE Journal of Solid-State Circuits vol. 42, No. 11, Nov. 2007.

Gerfers et al.; "A 0.2-2 Gb/s 6x OSR Receiver Using a Digitally Self-Adaptive Equalizer", IEEE Journal of Solid-State Circuits, vol. 43, No. 6, Jun. 2008.

Beyene et al; "The Design of Continuous-Time Linear Equalizers Using Model Order Reduction Techniques", 978-1-4244-2873-1/08/$25.00 (c) 2008 IEEE.

Liu et al.; "Ultra-Low Power On-Chip Differential Interconnects Using High-Resolution Comparator" 978-1-4673-2538-7/12/$31 (c) IEEE 2012.

Manian et al.; A 32-GB/s 9.3-mW CMOS Equalizer with 0.73-V Supply, 978-1-4799-3286-3/14/$31.00 (c) 2014 IEEE.

Gondi et al.; "Equalization and Clock and Data Recovery Techniques for 10-Gb/s CMOS Serial-Link Receivers" manuscript received Jul. 26, 2006, revised Feb. 26, 2007, Digital Object Identifier 10.1109/JSSC.2007.903076, 0018-9200/$25.00 (c) 2007 IEEE.

* cited by examiner

CONTINUOUS TIME LINEAR EQUALIZER THAT USES CROSS-COUPLED CASCODES AND INDUCTIVE PEAKING

BACKGROUND

Field

The disclosed embodiments relate to the design of a linear equalizer for reversing distortion incurred in a signal that is transmitted through a channel. More specifically, the disclosed embodiments relate to the design of a continuous time linear equalizer that uses both cross-coupled cascodes and inductive peaking to reverse distortion in a signal transmitted through a channel by attenuating lower frequencies and amplifying higher frequencies.

Related Art

In communication circuitry design, a continuous time linear equalizer (CTLE) is often used as a simple and effective component to equalize channel loss and extend the link bandwidth. Compared with other sophisticated equalization techniques, using a CTLE is typically the most economic option in terms of power consumption and complexity. Traditionally, an active CTLE is implemented through a source-degeneration network as illustrated in FIG. 1A. As illustrated in FIG. 1A, CTLE 100 receives a differential input signal comprising input$_1$ 123 and input$_2$ 124, and performs an equalization operation on this differential input signal to generate a differential output signal comprising output$_1$ 133 and output$_2$ 134.

Unfortunately, the equalizer design illustrated in FIG. 1A suffers from a number of performance issues. Low frequency signals gains are usually attenuated below zero dB by the equalizer. As a consequence, extra amplification is needed after the CTLE, which increases the complexity and power consumption in applications. Also, in order to boost high frequency gain and extend the link bandwidth, it is necessary to provide a larger transconductance $g_m$ for transistors 117 and 118, which implies using larger device geometries and consuming more power. Furthermore, larger device geometries are associated with larger parasitics, which can significantly slow down the operation of the CTLE.

Hence, what is needed is an equalizer design that overcomes the above-described problems.

SUMMARY

The disclosed embodiments relate to the design of an equalizer. This equalizer includes a differential input comprising a first input and a second input, and a differential output comprising a first output and a second output. It also includes a first inductor and a second inductor, wherein the upper terminals of the first and second inductors are coupled to $V_{DD}$. The equalizer likewise includes a first resistor with an upper terminal coupled to a lower terminal of the first inductor. It also includes a second resistor with an upper terminal coupled to a lower terminal of the second inductor.

The equalizer additionally includes a first cascode comprising a first upper transistor and a first lower transistor, wherein the drain of the first upper transistor is coupled to a lower terminal of the first resistor and also to the first output. Also, the gate of the first upper transistor is cross-coupled to the lower terminal of the second inductor. Moreover, the source of the first upper transistor is coupled to the drain of the first lower transistor, and the gate of the first lower transistor is coupled to the first input.

The equalizer also includes a second cascode comprising a second upper transistor and a second lower transistor, wherein the drain of the second upper transistor is coupled to a lower terminal of the second resistor and also to the second output. Also, the gate of the second upper transistor is cross-coupled to the lower terminal of the first inductor. Moreover, the source of the second upper transistor is coupled to the drain of the second lower transistor, and the gate of the second lower transistor is coupled to the second input.

Finally, the equalizer includes a first current source coupled between the source of the first lower transistor and ground, and a second current source coupled between the source of the second lower transistor and ground.

In some embodiments, the equalizer also includes a source-degeneration resistor coupled between the source of the first lower transistor and the source of the second lower transistor.

In some embodiments, the first upper transistor, the first lower transistor, the second upper transistor and the second lower transistor comprise nanoscale FinFET devices.

In some embodiments, increased impedances of the first and second inductors at higher frequencies act to boost a gain of the equalizer at the higher frequencies.

In some embodiments, the equalizer comprises a continuous time linear equalizer.

In some embodiments, a differential signal that feeds into the differential input is received from a communication channel.

In some embodiments, the first and second inductors, the first and second resistors, the first and second cascodes and the first and second current sources are integrated onto a single semiconductor chip.

The disclosed embodiments also relate to a method for operating an equalizer. During this method, the system receives a differential input signal. Next, the system uses the equalizer to perform an equalization operation on the differential input signal to produce a differential output signal, wherein the equalizer uses cross-coupled cascodes with inductive peaking to equalize the differential input signal.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Equalizer Design

Figure 1A:
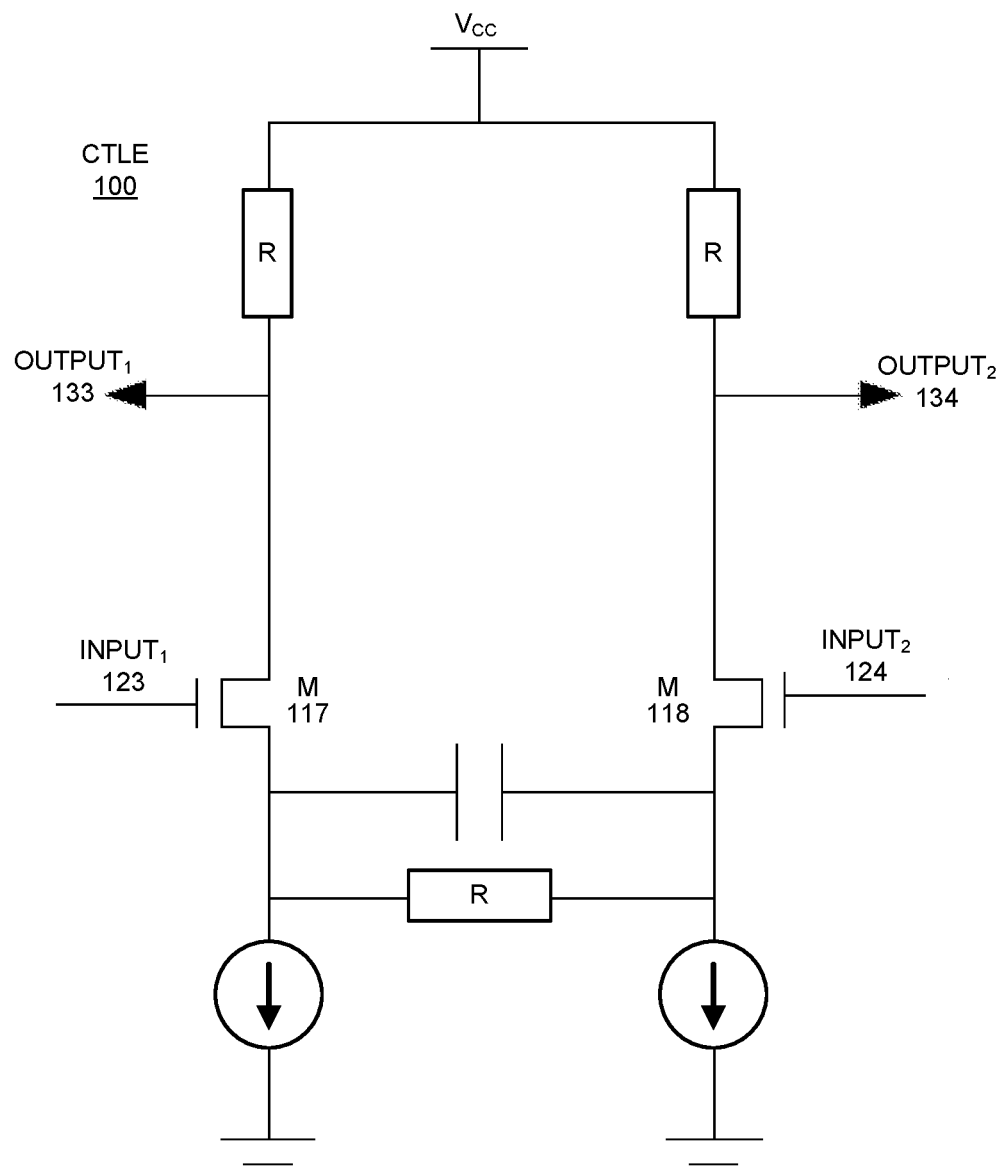
FIG. 1A illustrates a conventional continuous time linear equalizer (CTLE).
Figure 1B:
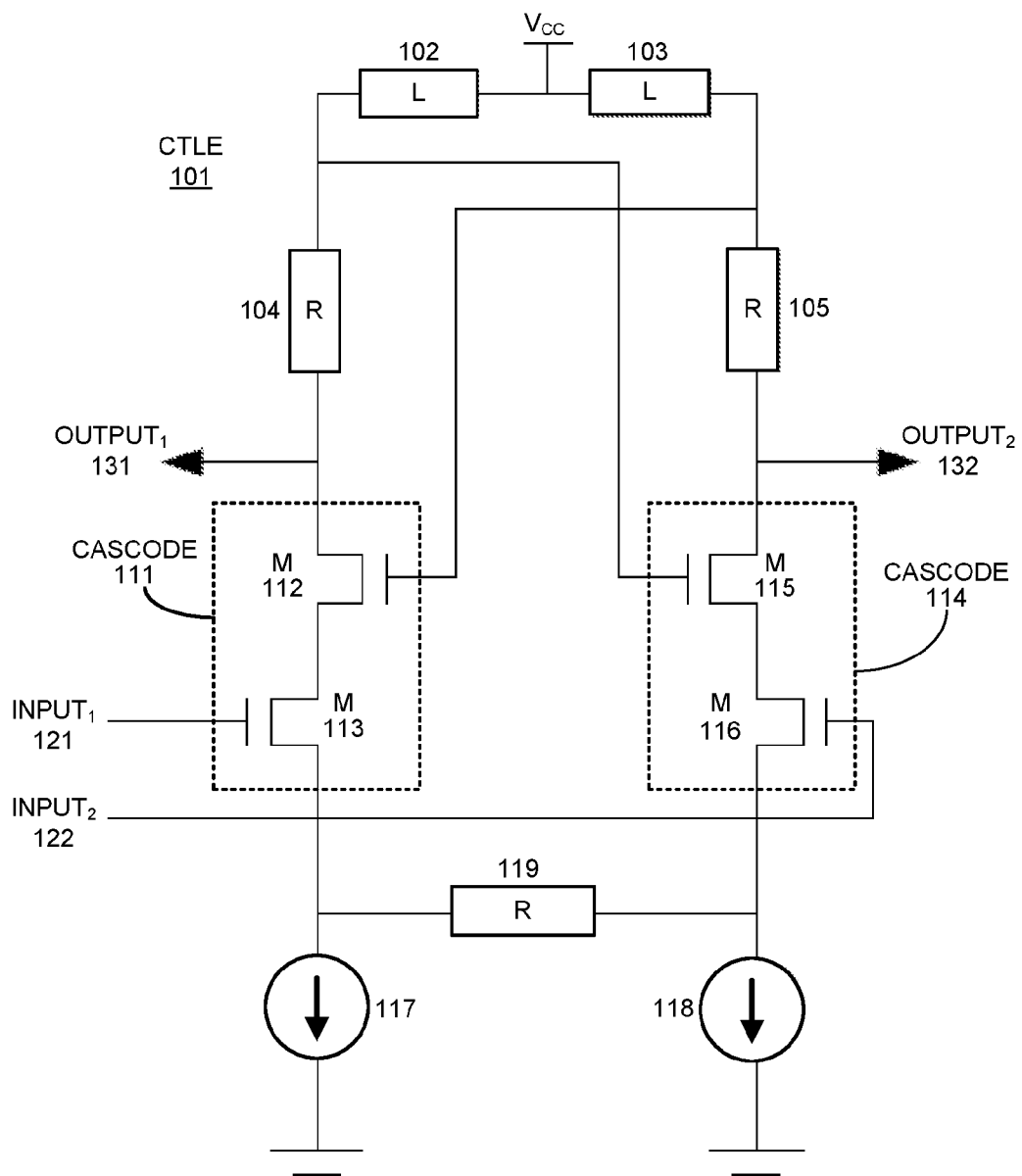
FIG. 1B illustrates a CTLE in accordance with the disclosed embodiments.

As semiconductor devices continue to decrease in size, power supply voltages for these devices are also being reduced. This reduced power supply voltage presents non-trivial challenges for implementing a CTLE, such as decreased gain at higher frequencies. To deal with these problems, a traditional cascode amplification structure is modified to implement an active CTLE 101 as is illustrated in FIG. 1B. At lower frequencies, when the effects of impedance from inductors 102-103 are negligible, the circuitry illustrated in FIG. 1B is essentially a traditional cascode amplifier that presents high gain. As operational frequency increases, the gain of a traditional cascode amplifier will decrease rapidly. However, as operational frequency increases, the impedance caused by inductors 102-103 also increases. The increased impedance of inductors 102-103 at higher frequencies enhances the positive feedback of the modified cascode, which in turn boosts the transconductance $g_m$ of the common gate devices 112 and 115 in the cascode. This increases the high frequency gain of the modified cascode amplifier.

As illustrated in FIG. 1B, CTLE 101 receives a differential input comprising $input_1$ 121 and $input_2$ 122, and generates a differential output comprising $output_1$ 131 and $output_2$ 132. To facilitate inductive peaking, CTLE 101 also includes a first inductor 102 and a second inductor 103, wherein the upper terminals of the first inductor 102 and the second inductor 103 are coupled to $V_{DD}$.

CTLE 101 also includes a first resistor 104 and a second resistor 105, wherein the upper terminal of first resistor 104 is coupled to the lower terminal first inductor 102, and the upper terminal of second resistor 105 is coupled to the lower terminal of second inductor 103.

CTLE 101 additionally includes a first cascode 111 comprising a first upper transistor 112 and a first lower transistor 113, wherein the drain of first upper transistor 112 is coupled to the lower terminal of first resistor 104 and also to $output_1$ 131. Moreover, the gate of first upper transistor 112 is cross-coupled to the lower terminal of second inductor 103. Also, the source of first upper transistor 112 is coupled to the drain of the first lower transistor 113, and the gate of first lower transistor 113 is coupled to the first $input_1$ 121.

Note that first cascode 111 is a useful two-transistor stage comprising transistors 112 and 113 that provides the performance of a common-emitter/-source stage with a much smaller Miller effect and a much higher output resistance. Cascodes were initially developed to achieve high-frequency performance, and the higher output resistance was viewed as a bonus. Designers presently take advantage of both features in a variety of applications.

CTLE 101 similarly includes a second cascode 114 comprising a second upper transistor 115 and a second lower transistor 116, wherein the drain of second upper transistor 115 is coupled to the lower terminal of second resistor 105 and also to $output_2$ 132. Moreover, the gate of second upper transistor 115 is cross-coupled to the lower terminal of first inductor 102. Also, the source of second upper transistor 115 is coupled to the drain of second lower transistor 116, and the gate of second lower transistor 116 is coupled to $input_2$ 122.

In some embodiments, the transistors 112, 113, 115 and 116 that comprise cascodes 111 and 114 are implemented using nanoscale Fin Field Effect Transistors (FinFETs). A FinFET is a non-planar, double-gate transistor typically implemented on a silicon on insulator (SOI) substrate. The distinguishing characteristic of a FinFET is that the conducting channel is wrapped by a thin silicon "fin," which forms the body of the device. The thickness of the fin (measured in the direction from source to drain) determines the effective channel length of the device. Moreover, the wraparound gate structure provides a better electrical control over the channel, thus helping to reduce the leakage current and to overcome other short-channel effects.

CTLE 101 additionally includes a first current source 117 coupled between the source of first lower transistor 113 and ground, and a second current source 118 coupled between the source of second lower 116 transistor and ground.

Finally, CTLE 101 includes a source-degeneration resistor 119 coupled between the source of first lower transistor 113 and the source of second lower transistor 116. Note that if the circuit illustrated in FIG. 1B experiences "over-peaking," source-degeneration resistor 119 can be adjusted to spread the gain and reduce the over-peaking.

Operation of the Equalizer

Figure 2:
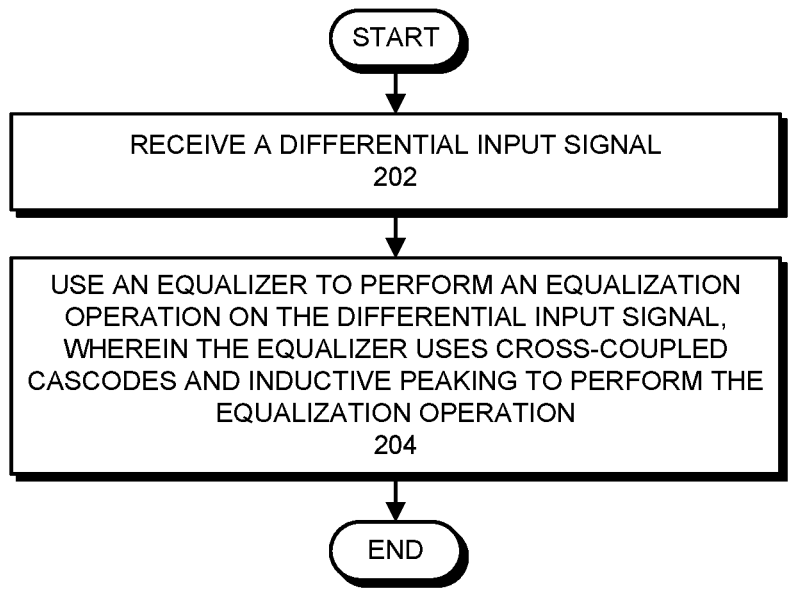
FIG. 2 presents a flow chart illustrating how an equalizer operates in accordance with an embodiment of the present disclosure.

FIG. 2 presents a flow chart illustrating how a system that includes an equalizer operates in accordance with an embodiment of the present disclosure. During operation, the system receives a differential input signal (step 202). Next, the system uses an equalizer to perform an equalization operation on the differential input signal to produce a differential output signal, wherein the equalizer uses cross-coupled cascodes with inductive peaking to equalize the differential input signal (step 204).

System

Figure 3:
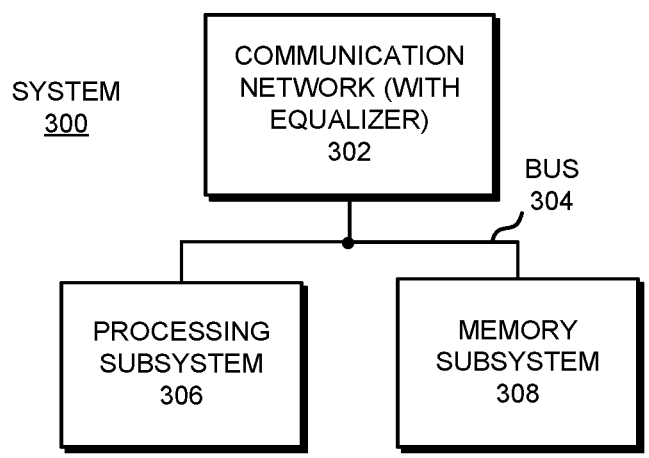
FIG. 3 illustrates a system that includes an equalizer in accordance with an embodiment of the present disclosure.

One or more of the preceding embodiments of the equalizer may be included in a system or device. More specifically, FIG. 3 illustrates a system 300 that includes a communication network 302, which includes an equalizer. As illustrated in FIG. 3, system 300 also includes a processing subsystem 306 comprising one or more processors and a memory subsystem 308 comprising memory.

In general, components within communication network 302 and system 300 may be implemented using a combination of hardware and/or software. Thus, system 300 may include one or more program modules or sets of instructions stored in a memory subsystem 308 (such as DRAM or another type of volatile or non-volatile computer-readable memory), which, during operation, may be executed by processing subsystem 306. Furthermore, instructions in the various modules in memory subsystem 308 may be implemented in: a high-level procedural language, an object-oriented programming language, and/or in an assembly or machine language. Note that the programming language may be compiled or interpreted, e.g., configurable or configured, to be executed by the processing subsystem.

Components in system 300 may be coupled by signal lines, links or buses, such as bus 304. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 300 may be at one location or may be distributed over multiple, geographically dispersed locations.

System 300 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, communication network 302 can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An equalizer, comprising:
a differential input comprising a first input and a second input;
a differential output comprising a first output and a second output;
a first inductor with a lower terminal and an upper terminal, wherein the upper terminal is coupled to $V_{DD}$;
a second inductor with a lower terminal and an upper terminal, wherein the upper terminal is coupled to $V_{DD}$;
a first resistor with an upper terminal and a lower terminal, wherein the upper terminal is coupled to the lower terminal of the first inductor;
a second resistor with an upper terminal and a lower terminal, wherein the upper terminal is coupled to the lower terminal of the second inductor;
a first cascode comprising a first upper transistor and a first lower transistor, wherein a drain of the first upper transistor is coupled to the lower terminal of the first resistor and the first output, wherein a gate of the first upper transistor is cross-coupled to the lower terminal of the second inductor, wherein a source of the first upper transistor is coupled to a drain of the first lower transistor, and wherein a gate of the first lower transistor is coupled to the first input;
a second cascode comprising a second upper transistor and a second lower transistor, wherein a drain of the second upper transistor is coupled to the lower terminal of the second resistor and the second output, wherein a gate of the second upper transistor is cross-coupled to the lower terminal of the first inductor, wherein a source of the second upper transistor is coupled to a drain of the second lower transistor, and wherein a gate of the second lower transistor is coupled to the second input;
a first current source coupled between a source of the first lower transistor and ground; and
a second current source coupled between a source of the second lower transistor and ground.

2. The equalizer of claim 1, further comprising a source-degeneration resistor coupled between the source of the first lower transistor and the source of the second lower transistor.

3. The equalizer of claim 1, wherein the first upper transistor, the first lower transistor, the second upper transistor and the second lower transistor comprise nanoscale FinFET devices.

4. The equalizer of claim 1, wherein increased impedances of the first and second inductors at higher frequencies act to boost a gain of the equalizer at the higher frequencies.

5. The equalizer of claim 1, wherein the equalizer comprises a continuous time linear equalizer.

6. The equalizer of claim 1, wherein a differential signal that feeds into the differential input is received from a communication channel.

7. The equalizer of claim 1, wherein the first and second inductors, the first and second resistors, the first and second cascodes and the first and second current sources are integrated onto a single semiconductor chip.

8. A system, comprising:
at least one processor;
at least one memory coupled to the at least one processor; and
an equalizer that facilitates communications among components in the system, wherein the equalizer includes:
a differential input comprising a first input and a second input;
a differential output comprising a first output and a second output;
a first inductor with a lower terminal and an upper terminal, wherein the upper terminal is coupled to $V_{DD}$;
a second inductor with a lower terminal and an upper terminal, wherein the upper terminal is coupled to $V_{DD}$;
a first resistor with an upper terminal and a lower terminal, wherein the upper terminal is coupled to the lower terminal of the first inductor;
a second resistor with an upper terminal and a lower terminal, wherein the upper terminal is coupled to the lower terminal of the second inductor;
a first cascode comprising a first upper transistor and a first lower transistor, wherein a drain of the first upper transistor is coupled to the lower terminal of the first resistor and the first output, wherein a gate of the first upper transistor is cross-coupled to the lower terminal of the second inductor, wherein a source of the first upper transistor is coupled to a drain of the first lower transistor, and wherein a gate of the first lower transistor is coupled to the first input;
a second cascode comprising a second upper transistor and a second lower transistor, wherein a drain of the second upper transistor is coupled to the lower terminal of the second resistor and the second output, wherein a gate of the second upper transistor is cross-coupled to the lower terminal of the first inductor, wherein a source of the second upper transistor is coupled to a drain of the second lower transistor, and wherein a gate of the second lower transistor is coupled to the second input;
a first current source coupled between a source of the first lower transistor and ground; and
a second current source coupled between a source of the second lower transistor and ground.

9. The system of claim 8, further comprising a source-degeneration resistor coupled between the source of the first lower transistor and the source of the second lower transistor.

10. The system of claim 8, wherein the first upper transistor, the first lower transistor, the second upper transistor and the second lower transistor comprise nanoscale FinFET devices.

11. The system of claim 8, wherein increased impedances of the first and second inductors at higher frequencies act to boost a gain of the equalizer at the higher frequencies.

12. The system of claim 8, wherein the equalizer comprises a continuous time linear equalizer.

13. The system of claim 8, wherein a differential signal that feeds into the differential input is received from a communication channel that facilitates communications among the components in the system.

14. The system of claim 8, wherein the first and second inductors, the first and second resistors, the first and second cascodes and the first and second current sources are integrated onto a single semiconductor chip within the system.

* * * * *